United States Patent
Song et al.

(10) Patent No.: US 9,705,101 B2
(45) Date of Patent: Jul. 11, 2017

(54) WHITE ORGANIC LIGHT EMITTING DEVICE HAVING EMISSION AREA CONTROL LAYER SEPARATING EMISSION AREAS OF AT LEAST TWO EMISSION LAYERS

(71) Applicant: LG Display Co., Ltd., Seoul (KR)

(72) Inventors: Jae Il Song, Paju-si (KR); Dong Hyuk Kim, Seoul (KR); So Yeon Ahn, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/692,600

(22) Filed: Apr. 21, 2015

(65) Prior Publication Data

US 2015/0311462 A1      Oct. 29, 2015

(30) Foreign Application Priority Data

Apr. 25, 2014   (KR) .................. 10-2014-0049867

(51) Int. Cl.
*H01L 51/50*       (2006.01)
*H01L 27/32*       (2006.01)

(52) U.S. Cl.
CPC ........ *H01L 51/504* (2013.01); *H01L 27/3209* (2013.01); *H01L 51/5056* (2013.01); *H01L 51/5072* (2013.01); *H01L 27/3248* (2013.01); *H01L 51/5044* (2013.01); *H01L 2251/5384* (2013.01)

(58) Field of Classification Search
CPC ............ H01L 51/5056; H01L 51/5072; H01L 51/504; H01L 27/3248
See application file for complete search history.

(56) References Cited

U.S. PATENT DOCUMENTS

| 7,332,860 B2 | 2/2008 | Hatwar et al. |
| 2005/0206305 A1 | 9/2005 | Masuda et al. |
| 2007/0126350 A1* | 6/2007 | Lee ................ H01L 51/5036 313/506 |

(Continued)

FOREIGN PATENT DOCUMENTS

| CN | 1671262 A | 9/2005 |
| CN | 103715224 A | 4/2014 |
| WO | WO 2013/161646 A1 | 10/2013 |

OTHER PUBLICATIONS

Office Action for Chinese Patent Application No. CN 201510197702.8, Sep. 1, 2016, 13 Pages, (With Concise Explanation of Relevance).

(Continued)

*Primary Examiner* — Michael Jung
(74) *Attorney, Agent, or Firm* — Fenwick & West LLP

(57) ABSTRACT

Disclosed is a white organic light emitting device in which a lifetime of a device is enhanced. The white organic light emitting device includes a first emission part between a first electrode and a second electrode and a second emission part on the first emission part. At least one among the first and second emission parts includes an emission area control layer. The white organic light emitting device includes a first emission part between a first electrode and a second electrode, a second emission part on the first emission part, and a third emission part on the second emission part. At least one among the first to third emission parts includes an emission area control layer.

30 Claims, 10 Drawing Sheets

(56) References Cited

U.S. PATENT DOCUMENTS

| | | | |
|---|---|---|---|
| 2007/0228938 A1 | 10/2007 | Hatwar et al. | |
| 2011/1029115 | 12/2011 | Shiratori | |
| 2013/0285039 A1* | 10/2013 | Ishihara | H01L 51/5265 257/40 |
| 2014/0091289 A1 | 4/2014 | Heo et al. | |
| 2014/0124753 A1* | 5/2014 | Lee | H01L 51/5012 257/40 |
| 2015/0060793 A1* | 3/2015 | Song | H01L 51/5044 257/40 |
| 2015/0090977 A1 | 4/2015 | Imai et al. | |
| 2016/0005990 A1* | 1/2016 | Lee | H01L 51/5278 257/40 |
| 2016/0035994 A1* | 2/2016 | Sung | H01L 51/5044 257/40 |

OTHER PUBLICATIONS

Cai, M., "Organic Light-Emitting Diodes (OLEDs) and Optically-Detected Magnetic Resonance (ODMR) Studies on Organic Materials," Iowa State University Graduate Theses and Dissertations, Paper 10388, 2011, 141 Pages.

Chen, S., et al., "White Organic Light-Emitting Diodes with Evenly Separated Red, Green, and Blue Colors for Efficiency/Color-Rendition Trade-Off Optimization," Advanced Functional Materials, 2011, 21, pp. 3785-3793.

Choudhury, B., "Organic light emitting devices (OLEDs) and structurally integrated photoluminescence based chemical and biological sensors excited by OLEDs," Iowa State University Retrospective Theses and Dissertations, Paper 1723, 2005, 130 Pages.

Deng, X., "Light-Emitting Devices with Conjugated Polymers," International Journal of Molecular Sciences, 2011, 12, pp. 1575-1594.

Hudson, Z., et al., "Enhancing Phosphorescence and Electrophosphorescence Efficiency of Cyclometalated Pt(II) Compounds with Triarylboron," Advanced Functional Materials, 2010, 20, pp. 3426-3439.

Kang, M., et al., "Highly Efficient Phosphorescent White Organic Light-Emitting Devices with a Poly(N-vinylcarbazole) Host Layer," Transactions on Electrical and Electronic Materials, 2011, 12, 2, pp. 80-83.

Kappaun, S., et al., "Phosphorescent Organic Light-Emitting Devices: Working Principle and Iridium Based Emitter Materials," International Journal of Molecular Sciences, 2008, 9, pp. 1527-1547.

Lo, Y.-H., "Emerging Optoelectronic Technologies and Applications," World Scientific, 1997, vol. 10, Cover page, Title Page, Table of Contents, p. 253.

Manhat, B. A., "Understanding the Emission from Semiconductor Nanoparticles," Portland State University Dissertations and Theses, Paper 465, 2012, 245 Pages.

Mazzeo, M., "Organic Light Emitting Diode," "Chapter 10: Organic Light Emitting Diode for White Light Emission," Sciyo, 2010, pp. 179-224.

Su, S.-J., et al., "RGB Phosphorescent Organic Light-Emitting Diodes by Using Host Materials with Heterocyclic Cores: Effect of Nitrogen Atom Orientations," Chemistry of Materials, 2011, 23, pp. 274-284.

Tsuboyama, A., et al., "Homoleptic Cyclometalated Iridium Complexes with Highly Efficient Red Phosphorescence and Application to Organic Light-Emitting Diode," Journal of American Chemical Society, 2003, 125, pp. 12971-12979.

Wang, J., et al., "High efficiency green phosphorescent organic light-emitting diodes with a low roll-off at high brightness," Organic Electronics, 2013, 14, pp. 2854-2858.

\* cited by examiner

WHITE ORGANIC LIGHT EMITTING DEVICE HAVING EMISSION AREA CONTROL LAYER SEPARATING EMISSION AREAS OF AT LEAST TWO EMISSION LAYERS

CROSS-REFERENCE TO RELATED APPLICATIONS

This application claims the priority benefit of the Korean Patent Application No. 10-2014-0049867 filed on Apr. 25, 2014, which is hereby incorporated by reference as if fully set forth herein.

BACKGROUND

Field of the Invention

The present invention relates to an organic light emitting device, and more particularly, to a white organic light emitting device in which a lifetime of a device is enhanced.

Discussion of the Related Art

Recently, as society advances to the information-oriented society, the field of display apparatuses, which visually express an electrical information signal, is rapidly advancing. Flat panel display (FPD) apparatuses, having excellent performance in terms of thinness, lightness, and low power consumption, have been developed.

Examples of the FPD apparatuses include LCD apparatuses, plasma display panel (PDP) apparatuses, field emission display (FED) apparatuses, organic light emitting display apparatuses, etc.

In particular, the organic light emitting display apparatuses are self-emitting devices. In comparison with other FPD apparatuses, the organic light emitting display apparatuses have a fast response time, high emission efficiency, high luminance, and a wide viewing angle.

An organic light emitting device includes an organic emission layer which is formed between two electrodes. Electrons and holes are injected from the two electrodes into the organic emission layer, and an exciton is generated by combining a electron with a hole. The organic light emitting device is a device using the principle that light is emitted when the generated exciton is dropped from an excited state to a ground state.

A related art organic light emitting display apparatus includes a blue emission layer formed of a fluorescent material, for realizing white. However, a quantum efficiency of an emission layer formed of a fluorescent material theoretically is about 25% of a quantum efficiency of an emission layer formed of a phosphorescence material. For this reason, the blue emission layer formed of a fluorescent material cannot show sufficient luminance in comparison with a phosphorescence material.

SUMMARY

Accordingly, the present invention is directed to provide a white organic light emitting device that substantially obviates one or more problems due to limitations and disadvantages of the related art.

In a related art organic light emitting device, emission characteristic and lifetime are limited due to emission structure and material of an organic emission layer. Therefore, various methods for enhancing emission efficiency and lifetime are proposed.

As one method, there is a method that uses an emission layer as a single layer. The method may manufacture a white organic light emitting device by using a single material or by doping two or more kinds of materials. For example, there is a method where a red dopant and a green dopant are applied to a blue host, or a red dopant, a green dopant, and a blue dopant are added to a host material having high bandgap energy. However, the energy transfer is incomplete to a dopant, and it is difficult to adjust a balance of white.

Moreover, a component of a dopant included in a corresponding emission layer is limited due to a characteristic of a dopant itself. Also, mixing of emission layers focuses on realizing white light, and thus, the wavelength characteristic has an emission peak value in a wavelength different from red, green, and blue. Therefore, a color reproduction ratio is reduced when a color filter is provided. Also, lifetimes of dopant materials differ, and for this reason, color shift occurs due to continuous use.

In another method, a structure may be provided where white light is emitted by stacking two emission layers having a complementary color relationship. However, in the structure, a difference between a peak wavelength range of each emission layer and a transmissive range of a color filter occurs when white light passes through the color filter. For this reason, a color range capable of expression is narrowed, and consequently, it is difficult to realize a desired color reproduction ratio.

For example, when a blue emission layer and a yellow emission layer are stacked, a peak wavelength is provided in a blue wavelength range and a yellow wavelength range, and thus, white light is emitted. When the white light passes through red, green, and blue color filters, a transmittance of the blue wavelength range is lowered compared to a red or green wavelength range, and for this reason, emission efficiency and color reproduction ratio are lowered.

Moreover, an emission efficiency of a yellow phosphorescence emission layer is relatively higher than that of a blue fluorescent emission layer, and thus, panel efficiency and a color reproduction ratio are reduced due to an efficiency difference between a phosphorescence emission layer and a fluorescent emission layer. Also, a luminance of blue is relatively lower than that of yellow.

In addition to such a structure, in a structure where a blue fluorescent emission layer and a green-red phosphorescence emission layer are stacked, a luminance of blue is relatively lower than that of green-red.

In order to solve the above-described problems, various methods for enhancing the lifetime of a device have been proposed. However, in a structure where the number of emission parts configuring emission layers increases, the manufacturing cost increases due to an increase in the number of processes, resulting in an increase in driving voltage due to an increase in the thickness of the device.

Therefore, the inventors recognize the above-described problems, and have experimented on various methods that can improve the lifetime of a device, in which two or more emission layers are provided in one emission part without increasing the number of emission parts configuring emission layers.

Therefore, the inventors have invented a white organic light emitting device having a new structure in which two or more emission layers are provided in one emission part, and thus, resulting in an enhanced lifetime of the device.

An aspect of the present invention is directed to provide a white organic light emitting device in which two or more emission layers are provided in one emission part, in which the emission areas are evenly distributed, and an emission area control layer for adjusting emission areas of two or more emission layers, thereby enhancing lifetime of a device.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a white organic light emitting device including: a first emission part between a first electrode and a second electrode; and a second emission part on the first emission part, wherein at least one among the first emission part and the second emission part includes at least two emission layers and an emission area control layer (EACL) that provides separation for emission areas of the at least two emission layers and includes a second host different from a first host in one of the at least two emission layers.

The at least two emission layers may include a red emission layer and a yellow-green emission layer.

A dopant of the EACL may be the same as a dopant of the yellow-green emission layer of the at least two emission layers.

The emission areas of the at least two emission layers may be separated based on a difference between a hole mobility of a host of the EACL and a hole mobility of a host of the yellow-green emission layer.

The hole mobility of the host of the EACL may be faster than the hole mobility of the host of the yellow-green emission layer.

The EACL may be a yellow-green emission layer.

When an emission part including the at least two emission layers is the second emission part, the first emission part may include an emission layer including a blue emission layer.

When an emission part including the at least two emission layers is the first emission part, the second emission part may include an emission layer including a blue emission layer.

The EACL may be adjacent to the at least two emission layers.

In another aspect of the present invention, there is provided a white organic light emitting device including: a first emission part between a first electrode and a second electrode; a second emission part on the first emission part; and a third emission part on the second emission part, wherein at least one among the first emission part, the second emission part, and the third emission part includes at least two emission layers and an emission area control layer (EACL) that provides separation for emission areas of the at least two emission layers and includes an emission layer that emits light having the same color as a color of light emitted from one of the at least two emission layers.

The at least two emission layers may include a red emission layer and a yellow-green emission layer.

An emission part including the at least two emission layers may include the EACL.

The EACL may be a yellow-green emission layer that emits light having the same color as a color of light emitted from one of the at least two emission layers.

A dopant of the EACL may be the same as a dopant of the yellow-green emission layer which is one of the at least two emission layers, and a host of the EACL may differ from a host of the yellow-green emission layer which is one of the at least two emission layers.

The emission areas of the at least two emission layers may be separated based on a difference between a hole mobility of a host of the EACL and a hole mobility of a host of the yellow-green emission layer.

The hole mobility of the EACL may be faster than the hole mobility of the yellow-green emission layer.

The EACL may be adjacent to the at least two emission layers.

When an emission part including the at least two emission layers is the second emission part, one among the first emission part and the third emission part may include an emission layer including a blue emission layer.

When an emission part including the at least two emission layers is the first emission part, one among the second emission part and the third emission part may include an emission layer including a blue emission layer.

When an emission part including the at least two emission layers is the third emission part, one among the first emission part and the second emission part may include an emission layer including a blue emission layer.

In another aspect of the present invention, there is provided a white organic light emitting device including: a first emission part between a first electrode and a second electrode; and a second emission part on the first emission part, wherein at least one among the first emission part and the second emission part includes at least two emission layers and a layer that causes emission areas of the at least two emission layers to be separated from each other.

The layer may cause a density of excitons, generated in one of the at least two emission layers, different from a density of excitons generated in the other emission layer.

The second emission part may include the at least two emission layers.

The at least two emission layers may include a red emission layer and a yellow-green emission layer.

The layer may be provided in the second emission part and may include a yellow-green emission layer.

A dopant of the layer may be the same as a dopant of the yellow-green emission layer in the second emission part, and a host of the layer may differ from a host of the yellow-green emission layer.

A hole mobility of a host in the layer may be faster than a hole mobility of a host in the yellow-green emission layer.

The hosts which differ and are respectively in the layer and the yellow-green emission layer of the second emission part may cause a distribution of excitons, generated in one of the at least two emission layers, different from a distribution of excitons generated in the other emission layer and cause the emission areas of the at least two emission layers to be apart from each other.

The white organic light emitting device may further include a third emission part disposed on the second emission part.

When an emission part including the at least two emission layers is the second emission part, each of the first emission part and the third emission part may include an emission layer including a blue emission layer.

Details of embodiments are included in a detailed description and the drawings.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
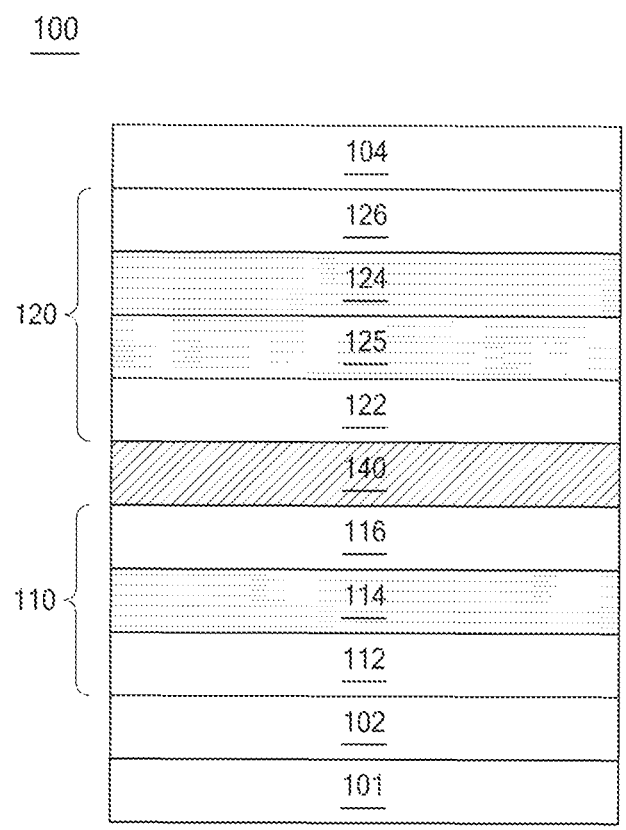
FIG. 1 is a diagram illustrating a white organic light emitting device according to an embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~' and 'next~', one or more other parts may be disposed between the two parts unless 'just' or 'direct' is used.

In describing a time relationship, for example, when the temporal order is described as 'after~', 'subsequent', 'next~', and 'before~' a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, embodiments of the present invention will be described in detail with reference to the accompanying drawings.

FIG. 1 is a diagram illustrating a white organic light emitting device 100 according to an embodiment of the present invention.

The white organic light emitting device 100 illustrated in FIG. 1 includes substrate 101, first and second electrodes 102 and 104 and first and second emission parts 110 and 120 between the first and second electrodes 102 and 104.

The first electrode 102 is an anode that supplies holes, and may be formed of indium tin oxide (ITO) or indium zinc oxide (IZO) which is a transparent conductive material such as transparent conductive oxide (TCO). However, the present embodiment is not limited thereto.

The second electrode 104 is a cathode that supplies electrons, and may be formed of gold (Au), silver (Ag), aluminum (Al), molybdenum (Mo), or magnesium (Mg) which is a metal material, or may be formed of an alloy thereof. However, the present embodiment is not limited thereto.

Each of the first electrode 102 and the second electrode 104 may be referred to as an anode or a cathode.

The first electrode 102 may be formed of a transmissive electrode, and the second electrode 104 may be formed of a reflective electrode. Alternatively, the first electrode 102 may be formed of a reflective electrode, and the second electrode 104 may be formed of a transmissive electrode.

The first emission part 110 may include a first hole transport layer (HTL) 112, a first emission layer (EML) 114, and a first electron transport layer (ETL) 116 which are on the first electrode 102.

Although not shown, a hole injection layer (HIL) may be further formed. The HIL may be on the first electrode 102 and enables a hole, supplied from the first electrode 102, to be smoothly injected. The first HTL 112 may supply a hole, supplied from the HIL, to the first EML 114. The first ETL 116 may supply an electron, supplied from the second electrode 104, to the first EML 114.

The HIL may be formed of 4,4',4"-tris(3-methylphenyl-phenylamino)triphenylamine (MTDATA), copper phthalocyanine (CuPc), poly(3,4-ethylenedioxythiphene, polystyrene sulfonate) (PEDOT/PSS), but is not limited thereto.

A hole supplied through the first HTL 112 and an electron supplied through the first ETL 116 may be recombined in the first EML 114 to emit light.

The first HTL 112 may be formed of the same material as that of the second HTL 122, but is not limited thereto.

The first HTL 112 may be formed of two or more layers or two or more materials.

The first ETL 116 may be formed of the same material as that of the second ETL 126, but is not limited thereto.

The first ETL 116 may be formed of two or more layers or two or more materials.

The first EML 114 may be configured with a blue emission layer or a red-blue emission layer. A peak wavelength of an emission area of the blue emission layer may be 440 nm to 480 nm. A peak wavelength of an emission area of a red emission layer may be 600 nm to 650 nm. Therefore, a peak wavelength of an emission area of the red-blue emission layer may be 440 nm to 650 nm.

A first charge generation layer (CGL) 140 may be further formed between the first emission part 110 and the second emission part 120. The first CGL 140 adjusts a balance of charges between the first emission part 110 and the second emission part 120. The first CGL 140 may include an N-type CGL and a P-type CGL.

The N-type CGL may be formed as an organic layer on which alkali metal such as lithium (Li), sodium (Na), potassium (K), or cesium (Cs) or alkali earth metal such as magnesium (Mg), strontium (Sr), barium (Ba), or radium (Ra) is doped, but is not limited thereto.

The P-type CGL may be formed as an organic layer including a P-type dopant, but is not limited thereto. The first CGL 140 may be formed of a single layer.

The second emission part 120 may include a second HTL 122, a first EML 124, and a second ETL 126. Although not shown, an electron injection layer (EIL) may be further formed on the second ETL 126. Also, a hole injection layer (HIL) may be further formed.

The second HTL 122 may be formed of the same material as that of the first HTL 112, but is not limited thereto.

The second HTL 122 may be formed of two or more layers or two or more materials.

The second ETL 126 may be formed of the same material as that of the first ETL 116, but is not limited thereto.

The second ETL 126 may be formed of two or more layers or two or more materials.

The first EML 124 of the second emission part 120 may be configured with a yellow-green emission layer. A peak wavelength of an emission area of the yellow-green emission layer may be 510 nm to 580 nm.

In the structure, the first EML 124 of the second emission part 120 is the yellow-green emission layer and should emit light in both a green area and a red area, and for this reason, an emission efficiency of a red emission layer is lower than that of a green emission layer. Therefore, a red emission layer may be further formed as the second EML 125, for enhancing an emission efficiency of the red emission layer.

Figure 2:
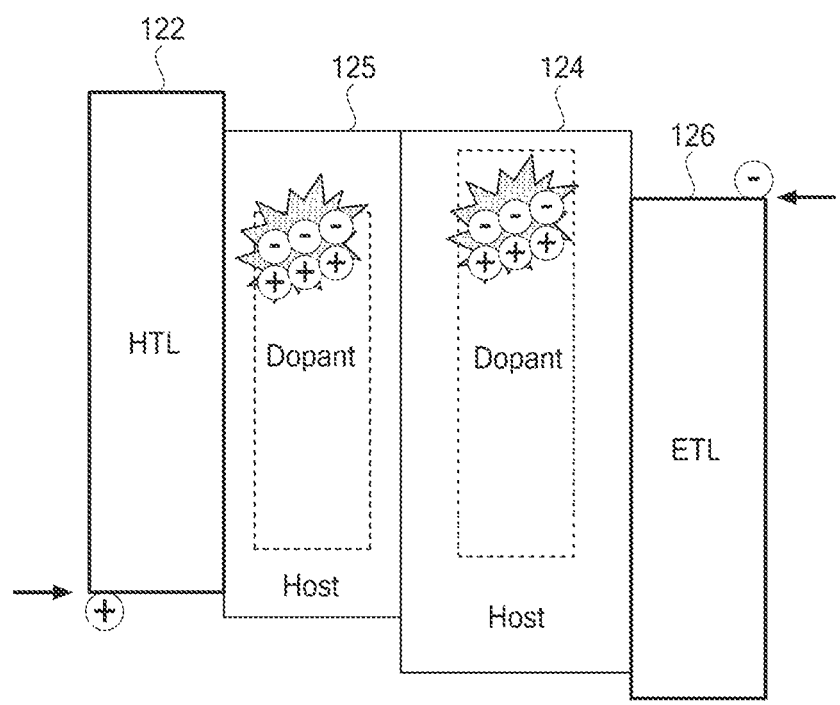
FIG. 2 is a diagram illustrating an energy band diagram of an emission part according to an embodiment of the present invention.

FIG. 2 is a diagram illustrating an energy band diagram of an emission part according to an embodiment of the present invention.

That is, FIG. 2 illustrates an energy band diagram when two emission layers are provided in the second emission part 120.

The second emission part 120 may be configured with two emission layers, for example, a yellow-green emission layer which is the first EML 124 of the second emission part 120 and a red emission layer which is the second EML 125.

When the second emission part 120 has the structure, a peak wavelength of an emission area of the red emission layer may be 600 nm to 650 nm, and a peak wavelength of an emission area of the yellow-green emission layer may be 510 nm to 580 nm. Since the emission area of the red emission layer is close to the emission area of the yellow-green emission layer, the emission area of the red emission layer and the emission area of the yellow-green emission layer agglomerate. Therefore, an emission area of the red emission layer and an emission area of the yellow-green emission layer may be disposed at a center portion between the red emission layer and the yellow-green emission layer. That is, each of the emission area of the red emission layer and the emission area of the yellow-green emission layer may be disposed at a position different from the original position. Also, the emission area of the yellow-green emission layer may be disposed at the original position, and a position of the emission area of the red emission layer may be shifted toward the yellow-green emission layer. Also, the emission area of the red emission layer may be disposed at the original position, and a position of the emission area of the yellow-green emission layer may be shifted toward the red emission layer. For this reason, deterioration of the second emission part 120 is accelerated, and lifetime of the device is shortened. Also, it is unable to realize a desired color at a peak wavelength of a desired emission area.

In order to solve the problems, the inventors have invented a structure where agglomeration of emission areas caused by a structure with two or more emission layers included in one emission part is prevented, the emission area is maximized, and the emission areas are evenly distributed.

That is, the inventors have invented a structure in which two or more emission layers are provided in one emission part, wherein the emission areas are evenly distributed, and which also includes an emission area control layer (EACL) for adjusting emission areas of two or more emission layers, thereby enhancing the lifetime of a device.

Figure 3:
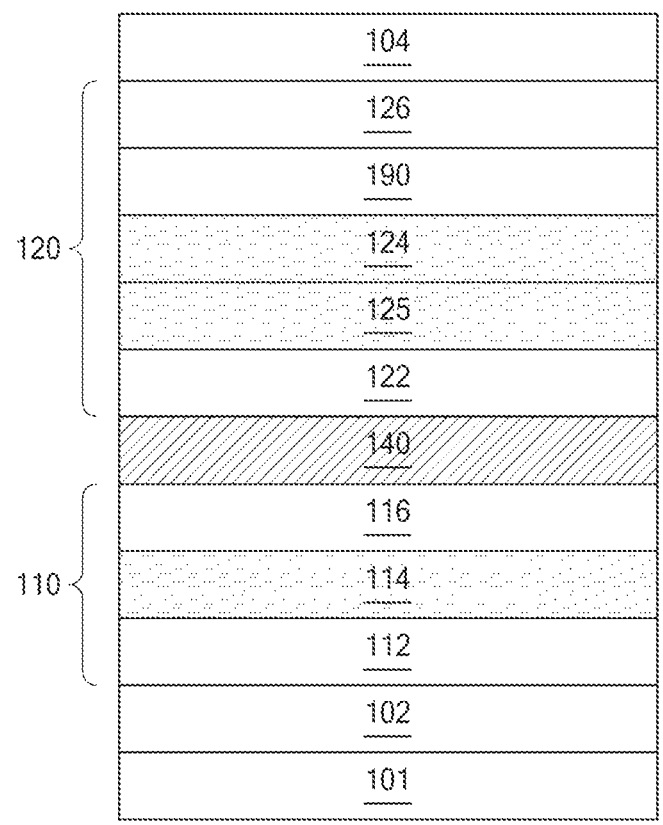
FIG. 3 is a diagram illustrating a white organic light emitting device according to another embodiment of the present invention.

FIG. 3 is a diagram illustrating a white organic light emitting device 200 according to another embodiment of the present invention.

In describing the present embodiment, elements which are the same as or correspond to the preceding embodiment are not described.

The white organic light emitting device 200 illustrated in FIG. 3 includes first and second electrodes 102 and 104 and first and second emission parts 110 and 120 between the first and second electrodes 102 and 104.

The second emission part 120 may include at least two emission layers and an EACL 190 that provides separation for emission areas of the at least two emission layers. The EACL 190 may be adjacent to the at least two emission layers. The EACL 190 may be on the at least two emission layers. Alternatively, the EACL 190 may be just on the at least two emission layers.

A first EML 124 of the second emission part 120 may be configured with a yellow-green emission layer, or a second EML 125 of the second emission part 120 may be configured with a red emission layer. The EACL 190 may be configured with a yellow-green emission layer. When an emission part including the at least two emission layers is the second emission part 120, the first emission part 110 may be configured with an emission layer including a blue emission layer.

A peak wavelength of an emission area of the yellow-green emission layer which is the first EML 124 of the second emission part 120 may be 510 nm to 580 nm. A peak wavelength of an emission area of the red emission layer which is the second EML 125 may be 600 nm to 650 nm.

A peak wavelength of an emission area of the yellow-green emission layer which is the EACL 190 may be 510 nm to 580 nm.

Moreover, the white organic light emitting device 200 according to another embodiment of the present invention may be applied to a bottom emission type, a top emission type, or a dual emission type.

Figure 4:
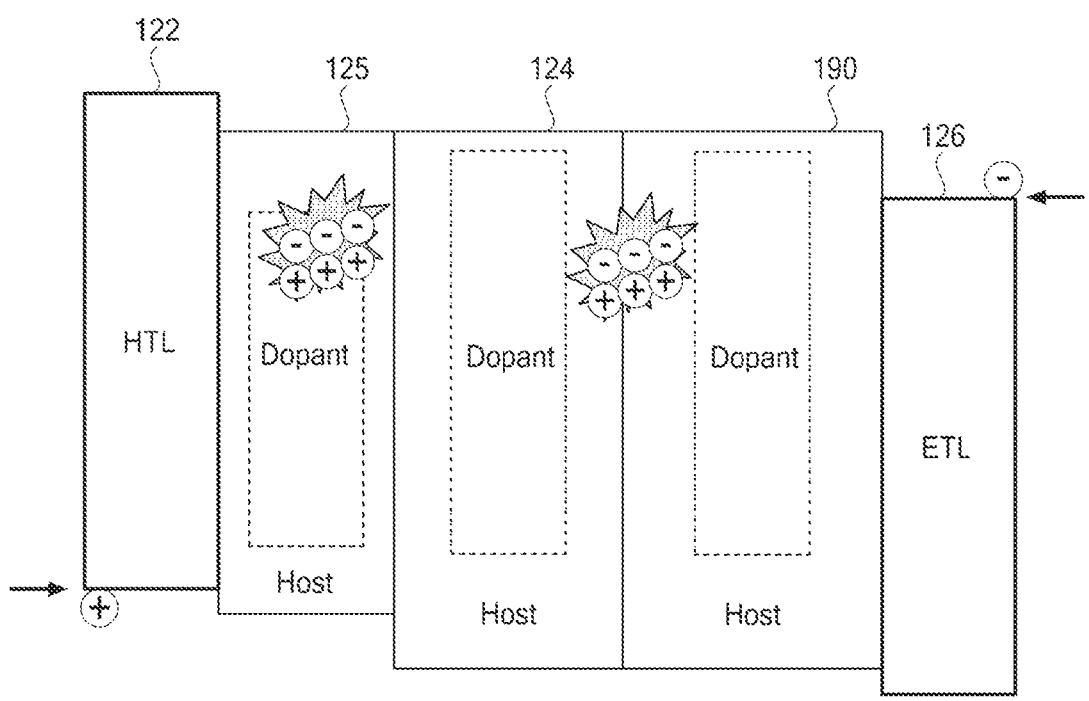
FIG. 4 is a diagram illustrating an energy band diagram of an emission part according to another embodiment of the present invention.

FIG. 4 is a diagram illustrating an energy band diagram of an emission part according to another embodiment of the present invention.

In the drawing, each of the first EML 124 and second EML 125 of the second emission part 120 are illustrated as including one dopant and one host, but may include one dopant and two hosts including a hole host and an electron host. When an emission layer consists of one dopant and two hosts, efficiency and lifetime of the emission layer are enhanced. However, the present embodiment is not limited thereto.

Moreover, in the drawing, the EACL 190 are illustrated as including one dopant and one host, but may include one dopant and two hosts including a hole host and an electron host. When the EACL 190 consists of one dopant and two hosts, efficiency and lifetime of an emission layer are enhanced. However, the present embodiment is not limited thereto.

The first EML 124 and EACL 190 of the second emission part 120 will be described with a case, where an emission layer consists of one dopant and two hosts, as an example. A hole may move from a hole host of the first EML 124 to a hole host of the EACL 190. An electron may move from an electrode host of the first EML 124 to an electron host of the EACL 190. Therefore, the hole and the electron may be combined to generate an exciton, and thus, light is emitted from an emission part.

The second emission part 120 may be configured with at least two emission layers. The EACL 190 may provide separation for the emission areas of the at least two emission layers. Here, the EACL 190 may include a second host different from a first host which is in one of the at least two emission layers. The EACL 190 may be adjacent to the at least two emission layers. Also, the EACL 190 may be configured with an emission layer that emits light having the same color as that of light emitted from one of the at least two emission layers. Therefore, the EACL 190 may be configured with a yellow-green emission layer that emits light having the same color as that of light emitted from the yellow-green emission layer which is one of the at least two emission layers. A dopant constituting the yellow-green emission layer which is the first EML 124 may be the same as a dopant constituting the yellow-green emission layer which is the EACL 190. Also, a host constituting the yellow-green emission layer which is the first EML 124 may differ from a host constituting the yellow-green emission layer which is the EACL 190. However, the present embodiment is not limited thereto. The host may consist of a hole host and a charge host which are two hosts, in addition to one host. A hole mobility of a host included in the EACL 190 may be faster than a host of the first EML 124. For example, a hole mobility of the EACL 190 may be faster than $1 \times 10^{-5}$ cm$^2$/Vs. Therefore, an exciton in the EACL 190 is generated faster than an exciton generated in the first EML 124, and thus, the exciton of the first EML 124 is separated from the second EML 125. For this reason, the host constituting the yellow-green emission layer which is the first EML 124 and the host constituting the yellow-green emission layer which is the EACL 190 may be differently constituted. Therefore, a distribution of excitons generated in the first EML 124 may differ from a distribution of excitons generated in the second EML 125, and the emission area of the first EML 124 may be separated from the emission area of the second EML 125. Also, a hole mobility of the host constituting the yellow-green emission layer which is the first EML 124 may differ from a hole mobility of the host constituting the yellow-green emission layer which is the EACL 190. Accordingly, the emission area of the first EML 124 and the emission area of the second EML 125 may be controlled.

As illustrated in FIG. 4, a density of the excitons generated in the first and second EMLs 124 and 125 may be lowered by the EACL 190 that provides separation for the emission areas of the at least two emission layers. That is, the EACL 190 may cause a density of the excitons, generated in the first EML 124, different from a density of the excitons generated in the second EML 125. Therefore, the distributed excitons of the first EML 124 are separated from the second EML 125 by the EACL 190. Accordingly, since the emission area of the first EML 124 is separated from the emission area of the second EML 125, agglomeration of emission areas is prevented, and a speed at which deterioration is made in the second emission part 120 is lowered. The EACL 190 may be a layer which causes the emission area of the first EML 124 to be separated from the emission area of the second EML 125. Also, the EACL 190 may be a layer which causes a distribution of the excitons, generated in the first EML 124, different from a distribution of the excitons generated in the second EML 125. Accordingly, since emission areas are evenly distributed in the second emission part 120, deterioration of the second emission part 120 is reduced, and the lifetime of a device is enhanced.

Figure 5A:
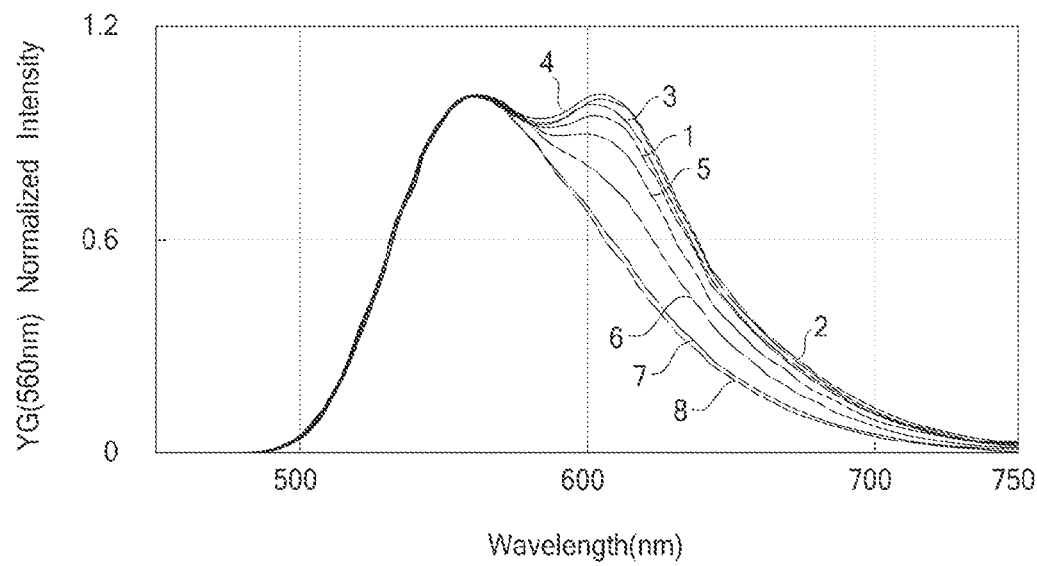
FIG. 5A is a diagram showing an emission intensity of an emission part according to another embodiment of the present invention.
Figure 5B:
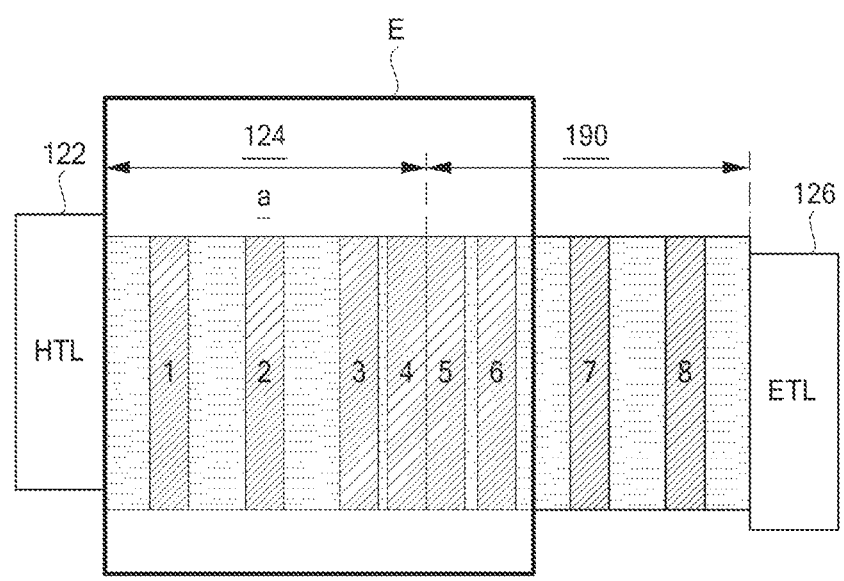
FIG. 5B is a diagram showing an emission area of an emission part according to another embodiment of the present invention.

FIG. 5A is a diagram showing an emission intensity of an emission part according to another embodiment of the present invention, and FIG. 5B is a diagram showing an emission area of an emission part according to another embodiment of the present invention.

That is, FIGS. 5A and 5B show an experimental result that is obtained by experimenting an emission area of an EACL according to another embodiment of the present invention, and show an emission area and an emission intensity of an emission part.

The inventors have repeated various experiments on a plurality of devices for checking whether the EACL 190 which provides separation for emission areas of at least two emission layers contributes to enhancing a lifetime of a device. Through the various experiments, devices listed in the following Table 1 are manufactured. It has been checked through the various experiments that when two or more emission layers are included in one emission part, a characteristic of a device is not affected, and lifetime of a device is enhanced.

Eight devices are provided for the present experiment, and structures of the devices are as shown in the following Table 1.

TABLE 1

| | Device | | | |
|---|---|---|---|---|
| | 1 | 2 | 3 | 4 |
| Structure | First EML (1) | First EML (2) | First EML (3) | First EML (4) |
| | EML | EML | EML | EML |
| | First EML (3) | First EML (2) | First EML (1) | — |
| | | EACL | | |
| | 5 | 6 | 7 | 8 |
| | | First EML | | |
| | — | EACL (1) | EACL (2) | EACL (3) |
| | EML | EML | EML | EML |
| | EACL (4) | EACL (3) | EACL (2) | EACL (1) |

In the present experiment, a device may be configured with the first EML 124, second EML 125, and EACL 190 of the second emission part 120, but as shown in Table 1, an arbitrary emission layer may be provided between the first EMLs 124 not including the second EML 125. The reason is because energy of the red emission layer which is the second EML 125 is higher than that of the yellow-green emission layer which is the first EML 124, and thus, red having high energy is displayed. Therefore, a structure of a device is provided as shown in Table 1 so as to check the emission area and emission intensity of the EACL 190. An emission area and an emission intensity of a red emission layer which is an arbitrary emission layer have been checked.

In Table 1, each of devices 1 to 3 may be configured with a first EML, an EML, and an EACL. The first EML may be expressed as a first EML (1) to a first EML (4) depending on varying thickness.

In the device 1, the first EML (1) may be a yellow-green emission layer and may have a thickness of 20 Å, and the EML may be a red emission layer which is an arbitrary emission layer and may have a thickness of 20 Å. The first EML (3) may be a yellow-green emission layer and may have a thickness of 160 Å, and a thickness of the EACL may be 200 Å. The thicknesses of the EMLs or a thickness of the EACL may be arbitrarily set for an experiment of the present invention, and the present invention is not limited thereto.

In the device 2, the first EML (2) may be a yellow-green emission layer and may have a thickness of 90 Å, and the EML may be a red emission layer which is an arbitrary emission layer and may have a thickness of 20 Å. The first EML (2) may be a yellow-green emission layer and may have a thickness of 90 Å, and a thickness of the EACL may be 200 Å. The thicknesses of the EMLs or a thickness of the EACL may be arbitrarily set for an experiment of the present invention, and the present invention is not limited thereto.

In the device 3, the first EML (3) may be a yellow-green emission layer and may have a thickness of 160 Å, and the EML may be a red emission layer which is an arbitrary emission layer and may have a thickness of 20 Å. The first EML (1) may be a yellow-green emission layer and may have a thickness of 20 Å, and a thickness of the EACL may be 200 Å. The thicknesses of the EMLs or a thickness of the EACL may be arbitrarily set for an experiment of the present invention, and the present invention is not limited thereto.

The device 4 may be configured with the first EML (4), the EML, and the EACL. The first EML (4) may be a yellow-green emission layer and may have a thickness of 180 Å, and the EML may be a red emission layer which is an arbitrary emission layer and may have a thickness of 20 Å. A thickness of the EACL may be 200 Å. The thicknesses of the EMLs or a thickness of the EACL may be arbitrarily set for an experiment of the present invention, and the present invention is not limited thereto.

In Table 1, each of the devices 5 to 8 may be configured with the first EML, the EACL, and the EML. The EACL may be expressed as the EACL (1) to the EACL (4) depending on varying thickness.

The device 5 may be configured with the first EML, the EML, and the EACL (4). A thickness of the first EML may be 200 Å, and the EML may be a red emission layer which is an arbitrary emission layer and may have a thickness of 20 Å. The EACL (4) may be a yellow-green emission layer and may have a thickness of 180 Å. The thicknesses of the EMLs or a thickness of the EACL may be arbitrarily set for an experiment of the present invention, and the present invention is not limited thereto.

Each of the devices 6 to 8 may be configured with the first EML, the EACL, and the EML. The EACL may be expressed as the EACL (1) to the EACL (3) depending on varying thickness.

In the device 6, a thickness of the first EML may be 200 Å, and the EACL (1) may be a yellow-green emission layer and may have a thickness of 20 Å. The EML may be a red emission layer which is an arbitrary emission layer and may have a thickness of 20 Å. The EACL (3) may be a yellow-green emission layer and may have a thickness of 160 Å. The thicknesses of the EMLs or a thickness of the EACL may be arbitrarily set for an experiment of the present invention, and the present invention is not limited thereto.

In the device 7, a thickness of the first EML may be 200 Å, and the EACL (2) may be a yellow-green emission layer and may have a thickness of 20 Å. The EML may be a red emission layer which is an arbitrary emission layer and may have a thickness of 20 Å. The EACL (2) may be a yellow-green emission layer and may have a thickness of 90 Å. The thicknesses of the EMLs or a thickness of the EACL may be arbitrarily set for an experiment of the present invention, and the present invention is not limited thereto.

In the device 8, a thickness of the first EML may be 200 Å, and the EACL (3) may be a yellow-green emission layer and may have a thickness of 160 Å. The EML may be a red emission layer which is an arbitrary emission layer and may have a thickness of 20 Å. The EACL (1) may be a yellow-green emission layer and may have a thickness of 20 Å. The thicknesses of the EMLs or a thickness of the EACL may be arbitrarily set for an experiment of the present invention, and the present invention is not limited thereto.

In FIG. 5A, emission intensities when an EACL according to an embodiment of the present invention is applied are shown. As a result of an emission intensity of a red emission layer, it can be seen that emission intensities of the devices 1 to 6 increase at 600 nm to 650 nm which is a peak wavelength of an emission area of the red emission layer.

That is, in the devices 1 to 6, an emission intensity of an emission peak area of the red emission layer is increased by an exciton which is generated between the EACL 190 and the first EML 124. On the other hand, in the devices 7 and 8, emission intensity is reduced at 600 nm to 650 nm which is a peak wavelength of the emission area of the red emission layer, and thus, it can be seen that an exciton is not generated in the devices 7 and 8. Therefore, it can be checked that emission intensity increases by applying the EACL according to an embodiment of the present invention.

As illustrated in FIG. 5B, the emission area of the first EML 124 is a portion referred to by "a". It can be seen that the emission area of the second emission part 120 is increased from the emission area "a" to an emission area "E" by the EACL 190. Through this, it can be checked that emission areas are evenly distributed in an emission part, deterioration of the emission part is reduced by separating emission areas of at least two emission layers, and lifetime of a device is enhanced.

Through the present experiment, it can be seen that when two emission layers are included in one emission part, emission areas of the two emission layers are separated from each other, and thus, agglomeration of emission areas which occurs between the two emission layers is prevented by an EACL. Therefore, it can be seen that emission areas are evenly distributed, and by providing separation for emission areas of at least two emission layers, an emission area increases, and emission intensity increases in a desired wavelength range.

Accordingly, since the emission areas are evenly distributed in the second emission part 120, deterioration of the second emission part 120 is reduced, and lifetime of a device is enhanced.

Figure 6:
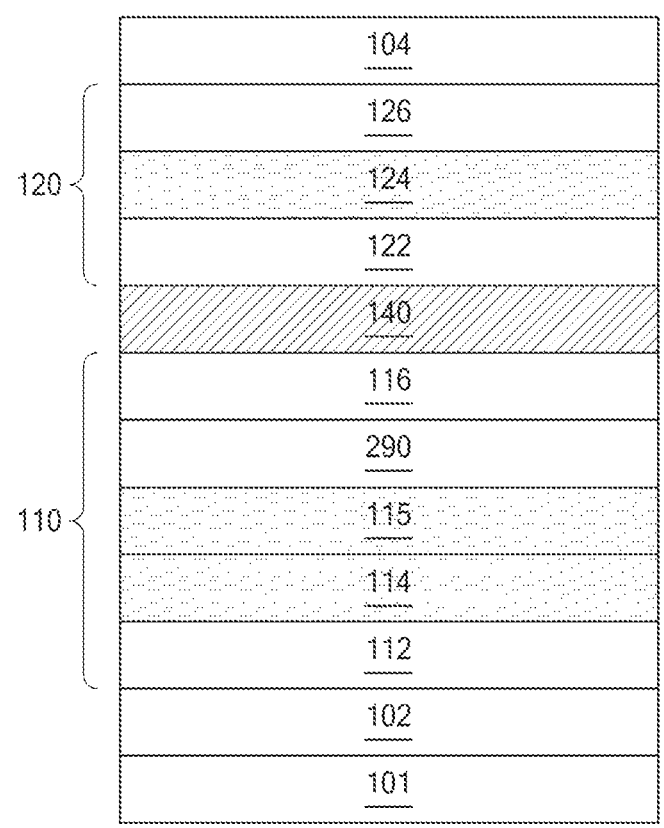
FIG. 6 is a diagram illustrating a white organic light emitting device according to another embodiment of the present invention.

FIG. 6 is a diagram illustrating a white organic light emitting device 300 according to another embodiment of the present invention. In describing the present embodiment, elements which are the same as or correspond to the preceding embodiment are not described.

The white organic light emitting device 300 according to another embodiment of the present invention includes first and second electrodes 102 and 104 and first and second emission parts 110 and 120 between the first and second electrodes 102 and 104. A first EML 114 of the first emission part 110 may be configured with a red emission layer, and a second EML 115 of the first emission part 110 may be configured with a yellow-green emission layer. A first EML 124 of the second emission part 120 may be configured with a blue emission layer.

Moreover, an EACL 290 may be provided in the first emission part 110. The EACL 290 may be configured with an emission layer that emits light having the same color as that of light emitted from one of the at least two emission layers. Therefore, the EACL 290 may be configured with a yellow-green emission layer that emits light having the same color as that of light emitted from the yellow-green emission layer which is one of the at least two emission layers. When an emission part including the at least two emission layers is the first emission part 110, the second emission part 120 may be configured with an emission layer including a blue emission layer. The EACL 290 may be adjacent to the at least two emission layers. The EACL 290 may be on the at least two emission layers. Alternatively, the EACL 290 may be just on the at least two emission layers.

A peak wavelength of an emission area of the red emission layer which is the first EML 114 of the first emission part 110 may be 600 nm to 650 nm. A peak wavelength of an emission area of the yellow-green emission layer which is the second EML 115 may be 510 nm to 580 nm. A peak wavelength of an emission area of the blue emission layer which is the first EML 124 of the second emission part 120 may be 440 nm to 480 nm.

A peak wavelength of an emission area of the yellow-green emission layer which is the EACL 290 may be 510 nm to 580 nm.

The first EML 124 of the second emission part 120 may be configured with a blue emission layer or a red-blue emission layer. A peak wavelength of an emission area of the blue emission layer may be 440 nm to 480 nm. A peak wavelength of an emission area of the red emission layer may be 600 nm to 650 nm. Therefore, a peak wavelength of an emission area of the red-blue emission layer may be 440 nm to 650 nm.

The first emission part 110 may be configured with at least two emission layers. The EACL 290 may provide separation for the emission areas of the at least two emission layers. Here, the EACL 290 may include a second host different from a first host which is included in one of the at least two emission layers. A dopant constituting the second EML 115 of the first emission part 110 may be the same as a dopant constituting the EACL 290, and a host constituting the second EML 115 of the first emission part 110 may differ from a host constituting the EACL 290. However, the present embodiment is not limited thereto.

The host may consist of a hole host and an electron host which are two hosts, in addition to one host. A hole mobility of a host included in the EACL 290 may be faster than a host of the second EML 115. For example, a hole mobility of the EACL 290 may be faster than $1 \times 10^{-5}$ cm$^2$/Vs. Therefore, an exciton generated in the EACL 290 is generated faster than an exciton generated in the second EML 115, and thus, the exciton of the second EML 115 is separated from the first EML 114.

For this reason, the host constituting the yellow-green emission layer which is the second EML 115 and the host constituting the yellow-green emission layer which is the EACL 290 may be differently constituted. Therefore, a distribution of excitons generated in the first EML 114 may differ from a distribution of excitons generated in the second EML 115, and the emission area of the first EML 114 may be separated from the emission area of the second EML 115. Also, a hole mobility of the host constituting the yellow-green emission layer which is the first EML 114 may differ from a hole mobility of the host constituting the yellow-green emission layer which is the EACL 290. Accordingly, the emission area of the first EML 114 and the emission area of the second EML 115 may be controlled.

A density of the excitons generated in the first and second EMLs 114 and 115 may be lowered by the EACL 290 that provides separation for the emission areas of the at least two emission layers. That is, the EACL 290 may cause a density of the excitons, generated in the first EML 114, different from a density of the excitons generated in the second EML 115. Therefore, the distributed excitons of the second EML 115 are separated from the first EML 114 by the EACL 290. Accordingly, since the emission area of the first EML 114 is apart from the emission area of the second EML 115, agglomeration of emission areas is prevented, and a speed at which deterioration is made in the first emission part 110 is lowered. The EACL 290 may be a layer which causes the emission area of the first EML 114 to be separated from the emission area of the second EML 115. Also, the EACL 290 may be a layer which causes a distribution of the excitons, generated in the first EML 114, different from a distribution of the excitons generated in the second EML 115. Accordingly, since emission areas are evenly distributed in the first emission part 110, deterioration of the first emission part 110 is reduced, and the lifetime of a device is enhanced.

Moreover, the white organic light emitting device 300 according to another embodiment of the present invention may be applied to the bottom emission type, the top emission type, or the dual emission type.

Figure 7:
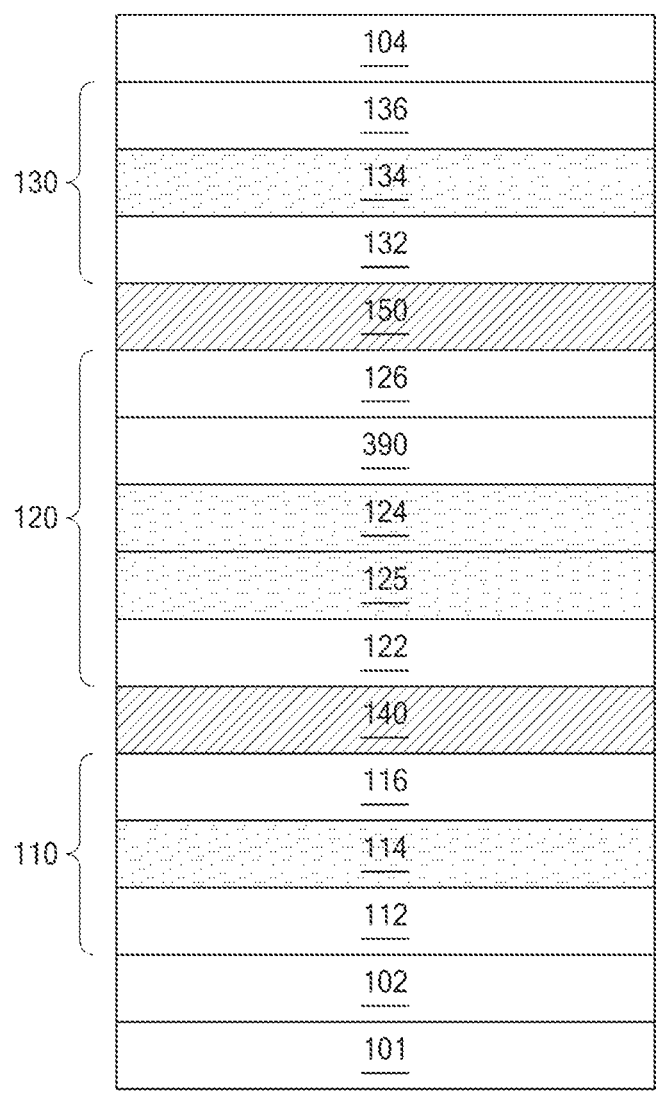
FIG. 7 is a diagram illustrating a white organic light emitting device according to another embodiment of the present invention.

FIG. 7 is a diagram illustrating a white organic light emitting device 400 according to another embodiment of the present invention. In describing the present embodiment, elements which are the same as or correspond to the preceding embodiment are not described.

The white organic light emitting device 400 according to another embodiment of the present invention includes first and second electrodes 102 and 104 and first to third emission parts 110 to 130 between the first and second electrodes 102 and 104. A first EML 114 of the first emission part 110 may be configured with a blue emission layer, and a first EML 124 of the second emission part 120 may be configured with a yellow-green emission layer.

A second EML 125 of the second emission part 120 may be further provided as a red emission layer, and thus, at least two emission layers may be provided in the second emission part 120. Also, an EACL 390 may be provided in the second emission part 120. The EACL 390 may be configured with a yellow-green emission layer. When an emission part including the at least two emission layers is the second emission part 120, the first emission part 110 or the third emission part 130 may be configured with an emission layer including a blue emission layer. The EACL 390 may be adjacent to the at least two emission layers. The EACL 390 may be on the at least two emission layers. Alternatively, the EACL 390 may be just on the at least two emission layers.

A peak wavelength of an emission area of the blue emission layer which is the first EML 114 of the first emission part 110 may be 440 nm to 480 nm.

A peak wavelength of an emission area of the yellow-green emission layer which is the first EML 124 of the second emission part 120 may be 510 nm to 580 nm.

A peak wavelength of an emission area of the red emission layer which is the second EML 125 of the second emission part 120 may be 600 nm to 650 nm.

A peak wavelength of an emission area of the yellow-green emission layer which is the EACL 390 may be 510 nm to 580 nm.

A quantum efficiency of a blue emission layer formed of a fluorescent material theoretically is about 25% of a quantum efficiency of an emission layer formed of a phosphorescence material. For this reason, the blue emission layer formed of a fluorescent material cannot show sufficient luminance compared to a phosphorescence material. Therefore, the first EML 134 may be further included in the third emission part 130 so as to enhance the lifetime of a device by improving an emission efficiency of the blue emission layer.

Therefore, in the white organic light emitting display device 400 according to another embodiment of the present invention, the blue emission layer may be formed as the first EML 114 of the first emission part 110, the yellow-green emission layer may be formed as the first EML 124 of the second emission part 120. The first EML 134 configuring the third emission part 130 may be formed as the blue emission layer.

Even in a structure where one emission part is further added, when the EACL according to an embodiment of the present invention is applied, emission efficiency is maintained, and the lifetime of a device is enhanced. This will be described below in detail with reference to FIG. 8 and Table 2.

A case where the second emission part 120 includes at least two emission layers is described as an example, but depending on a structure or a characteristic of a device, the first emission part 110 may be configured with two or more emission layers. Also, the third emission part 130 may be configured with two or more emission layers depending on a structure or a characteristic of a device.

The second emission part 120 may be configured with at least two emission layers. The EACL 390 may provide separation for the emission areas of the at least two emission layers. Here, the EACL 390 may include a second host different from a first host which is included in one of the at least two emission layers. The first EML 124 of the second emission part 120 may include one dopant and one host, or may consist of one dopant and two hosts including a hole host and an electron host. When the first EML 124 includes one dopant and two hosts, efficiency and lifetime of the emission layer are enhanced. However, the present embodiment is not limited thereto.

The EACL 390 may include one dopant and one host, or may include one dopant and two hosts including a hole host and an electron host. When the EACL 390 consists of one dopant and two hosts, efficiency and lifetime of the emission layer are enhanced. However, the present embodiment is not limited thereto.

A dopant constituting the yellow-green emission layer which is the first EML 124 of the second emission part 120 may be the same as a dopant constituting the yellow-green emission layer which is the EACL 390. Also, a host constituting the yellow-green emission layer which is the first EML 124 of the second emission part 120 may differ from a host constituting the yellow-green emission layer which is the EACL 390. The host may consist of a hole host and an electron host which are two hosts, in addition to one host. A hole mobility of a host included in the EACL 390 may be faster than a host of the first EML 124. For example, a hole mobility of the EACL 390 may be faster than $1\times10^{-5}$ cm$^2$/Vs. Therefore, an exciton generated in the EACL 390 is generated faster than an exciton generated in the first EML 124, and thus, the exciton of the first EML 124 is separated from the second EML 125. For this reason, the host constituting the yellow-green emission layer which is the first EML 124 and the host constituting the yellow-green emission layer which is the EACL 390 may be differently constituted. Therefore, a distribution of excitons generated in the first EML 124 may differ from a distribution of excitons generated in the second EML 125, and the emission area of the first EML 124 may be separated from the emission area of the second EML 125. Also, a hole mobility of the host constituting the yellow-green emission layer which is the first EML 124 may differ from a hole mobility of the host constituting the yellow-green emission layer which is the EACL 390. Accordingly, the emission area of the first EML 124 and the emission area of the second EML 125 may be controlled.

A density of the excitons generated in the first and second EMLs 124 and 125 may be lowered by the EACL 390 that provides separation for the emission areas of the at least two emission layers. That is, the EACL 390 may make a density of the excitons, generated in the first EML 124, different from a density of the excitons generated in the second EML 125. Therefore, the distributed excitons of the first EML 124 are separated from the second EML 125 by the EACL 390. Accordingly, since the emission area of the first EML 124 is separated from the emission area of the second EML 125, agglomeration of emission areas is prevented, and a speed at which deterioration is made in the second emission part 120 is lowered. The EACL 390 may be a layer which causes the emission area of the first EML 124 to be separated from the emission area of the second EML 125. Also, the EACL 390 may be a layer which causes a distribution of the excitons, generated in the first EML 124, different from a distribution of the excitons generated in the second EML 125.

Accordingly, since emission areas are evenly distributed in the second emission part 120, deterioration of the second emission part 120 is reduced, and the lifetime of a device is enhanced.

The first emission part 110 and the second emission part 120 are the same as or correspond to the preceding embodiment, and thus, their detailed descriptions are not repeated.

The third emission part 130 may include a third ETL 136, a first EML 134, and a third HTL 132 which are under the second electrode 104. Although not shown, an EIL may be further formed on the third ETL 136. Also, an HIL may be further provided.

The third HTL 132 may be formed of N,N'-diphenyl-N, N'-bis(3-methylphenyl)-1,1'-bi-phenyl-4,4'-diamine (TPD) or N,N'-di(naphthalen-1-yl)-N,N'-diphenyl-benzidine (NPB), but is not limited thereto.

The third HTL 132 may be formed of two or more layers or two or more materials.

The third ETL 136 may be formed of oxadiazole, triazole, phenanthroline, benzoxazole, or benzthiazole, but is not limited thereto.

The third ETL 136 may be formed of two or more layers or two or more materials.

The first EML 134 may be configured with a blue emission layer or a red-blue emission layer. A peak wavelength of an emission area of the blue emission layer may be 440 nm to 480 nm. A peak wavelength of an emission area of a red emission layer may be 600 nm to 650 nm. Therefore, a peak wavelength of an emission area of the red-blue emission layer may be 440 nm to 650 nm.

A second CGL 150 may be further formed between the second emission part 120 and the third emission part 130. The second CGL 150 adjusts a balance of charges between the second emission part 120 and the third emission part 130. The second CGL 150 may include an N-type CGL and a P-type CGL.

The N-type CGL may inject an electron into the second emission part 120, and the P-type CGL may inject a hole into the third emission part 130. However, the present embodiment is not limited thereto. For example, the second CGL 150 may be formed of a single layer.

The N-type CGL may be formed as an organic layer on which alkali metal such as lithium (Li), sodium (Na), potassium (K), or cesium (Cs) or alkali earth metal such as magnesium (Mg), strontium (Sr), barium (Ba), or radium (Ra) is doped, but is not limited thereto.

The P-type CGL may be formed as an organic layer including a P-type dopant, but is not limited thereto. The first CGL 140 may be formed of the same material as that of each of the N-type CGL and P-type CGL of the second CGL 150, but is not limited thereto.

Moreover, the white organic light emitting device 400 according to another embodiment of the present invention may be applied to the bottom emission type, the top emission type, or the dual emission type.

Figure 8:
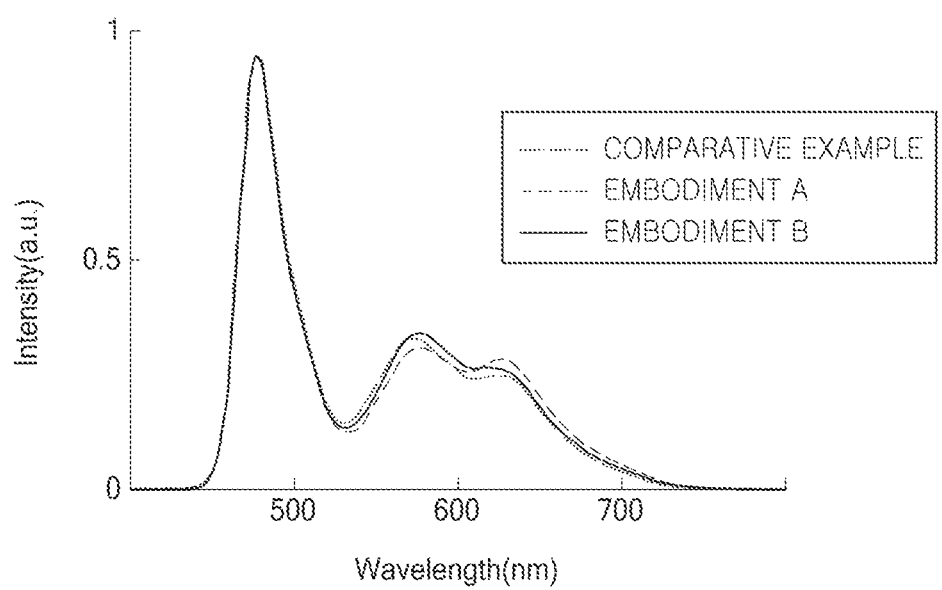
FIG. 8 is a diagram showing an emission intensity of a white organic light emitting device according to a comparative example and an emission intensity of a white organic light emitting device according to embodiments of the present invention.

FIG. 8 is a diagram showing an emission intensity of a white organic light emitting device according to a comparative example and an emission intensity of a white organic light emitting device according to embodiments of the present invention.

In the comparative example, the red emission layer and the yellow-green emission layer are provided in the second emission part.

In an embodiment of the present invention, first to third emission parts are provided, and two or more emission layers and an EACL are provided in the second emission part. The first EML 114 of the first emission part is configured with the blue emission layer. The first and second EMLs 124 and 125 of the second emission part may be respectively configured with the yellow-green emission layer and the red emission layer. The EACL is configured with the yellow-green emission layer. The first EML 134 of the third emission part is configured with the blue emission layer.

In FIG. 8, the abscissa axis indicates a wavelength range of light, and the ordinate axis indicates emission intensity.

Thicknesses of a first EML, a second EML, and an EACL are differently applied to embodiments A and B. A sum of thicknesses of the first EML and the EACL applied to the embodiment A is equal to a thickness of the first EML applied to the comparative example. A sum of thicknesses of the first EML and the EACL applied to the embodiment B is greater than a thickness of the first EML applied to the comparative example.

As shown in FIG. 8, it can be seen that emission intensities of the comparative example, the embodiment A, and the embodiment B are hardly changed in a range of 440 nm to 480 nm which is the peak wavelength of the emission area of the blue emission layer. Through this, it can be seen that when two or more emission layers are provided in one emission part, the lifetime of an emission layer is not affected, and emission intensity is maintained.

It can be seen that the emission intensity of the embodiment B is higher than that of the comparative example in a range of 510 nm to 580 nm which is the peak wavelength of the emission area of the yellow-green emission layer. Through this, it can be seen that an emission efficiency of the blue emission layer increases without any reduction in the emission efficiency of the blue emission layer, and thus, the lifetime of a device is enhanced. Comparing the embodiment A with the embodiment B, it can be seen that the emission intensity of the embodiment B is higher than that of the embodiment A. This is because in the embodiment B, as a thickness of a device is thickened, an exciton in the emission layer moves to the ETL, and thus, damage of the HTL by the exciton is reduced.

It can be seen that the emission intensities of the embodiment A and the embodiment B are higher than that of the comparative example in a range of 600 nm to 650 nm which is the peak wavelength of the emission area of the red emission layer. Through this, it can be seen that an emission efficiency of the red emission layer increases without any reduction in the emission efficiency of the red emission layer, and thus, the lifetime of a device is enhanced. Also, an emission efficiency of the red emission layer is prevented from being degraded in manufacturing a device.

As described above, when the EACL according to an embodiment of the present invention is applied, the characteristic of a device is maintained, and lifetime of the device is enhanced.

The following Table 2 shows a result that is obtained by comparing emission efficiencies, quantum efficiencies, and lifetimes according to the comparative example and an embodiment.

Details of the comparative example, the embodiment A, and the embodiment B are the same as the details described above with reference to FIG. 7. That is, in an embodiment of the present invention, first to third emission parts are provided, and two or more emission layers and an EACL are provided in the second emission part. The first EML 114 of the first emission part is configured with the blue emission layer. The first EML 124 of the second emission part may be configured with the yellow-green emission layer and the second EML 125 of the second emission part may be configured with the red emission layer. The EACL is formed as the yellow-green emission layer on the first EML 124. The first EML 134 of the third emission part is configured with the blue emission layer.

In the comparative example, the red emission layer and the yellow-green emission layer are provided as emission layers in the second emission part.

TABLE 2

|  |  | Comparative Example | Embodiment A | Embodiment B |
|---|---|---|---|---|
| Efficiency (cd/A) | R (red) | 1.0 | 1.1 | 1.1 |
|  | G (green) | 1.0 | 0.9 | 1.0 |
|  | B (blue) | 1.0 | 1.0 | 1.0 |
|  | W (white) | 1.0 | 1.0 | 1.0 |
| Device Characteristic (10 mA/cm$^2$) | V (voltage) | 1.0 | 1.0 | 1.0 |
|  | EQE | 1.0 | 1.0 | 1.0 |
| Lifetime | R (red) | 1.0 | 1.3 | 1.5 |
|  | G (green) | 1.0 | 1.2 | 1.4 |
|  | B (blue) | 1.0 | 1.1 | 1.2 |
|  | W (white) | 1.0 | 1.2 | 1.4 |

As shown in Table 2, it can be seen that emission intensities of emission layers are hardly changed in the comparative example, the embodiment A, and the embodiment B. It can be seen that when two emission layers are provided in one emission part, efficiencies of the embodiment A and the embodiment B are not changed compared to the comparative example. Therefore, it can be seen that when two emission layers are provided in one emission part, the characteristic of a device is not affected, and emission efficiency is maintained.

Moreover, in regard to a characteristic of a device, it can be seen that a driving voltage (V) does not increase despite two or more emission layers being provided in one emission part.

External quantum efficiency (EQE) denotes emission efficiency of when light is transferred to outside an organic light emitting device. In comparison with the comparative example, it can be seen that EQE is not changed despite two or more emission layers being provided in one emission part. That is, emission efficiency is not changed.

Moreover, it can be seen that lifetimes of emission layers are enhanced by 10% to 50% in comparison with the comparative example. That is, in comparison with the comparative example, even when two or more emission layers are provided in one emission part, the lifetime of a device is not shortened, and lifetimes of each of the red, green, and blue emission layers is enhanced. Accordingly, in white, it can be seen that a life of a device is enhanced by 20% to 40% in comparison with the comparative example.

Moreover, even when one emission part in addition to two emission parts is further provided, by applying the EACL according to an embodiment of the present invention, a characteristic of a device such as emission efficiency is maintained, and lifetime of the device is enhanced.

In the present embodiment, a case where the second emission part includes at least two emission layers has been described above as an example, but depending on a structure or a characteristic of a device, the first emission part in addition to the second emission part may be configured with two or more emission layers. Also, the third emission part in addition to the second emission part may be configured with two or more emission layers depending on a structure or a characteristic of a device.

Figure 9:
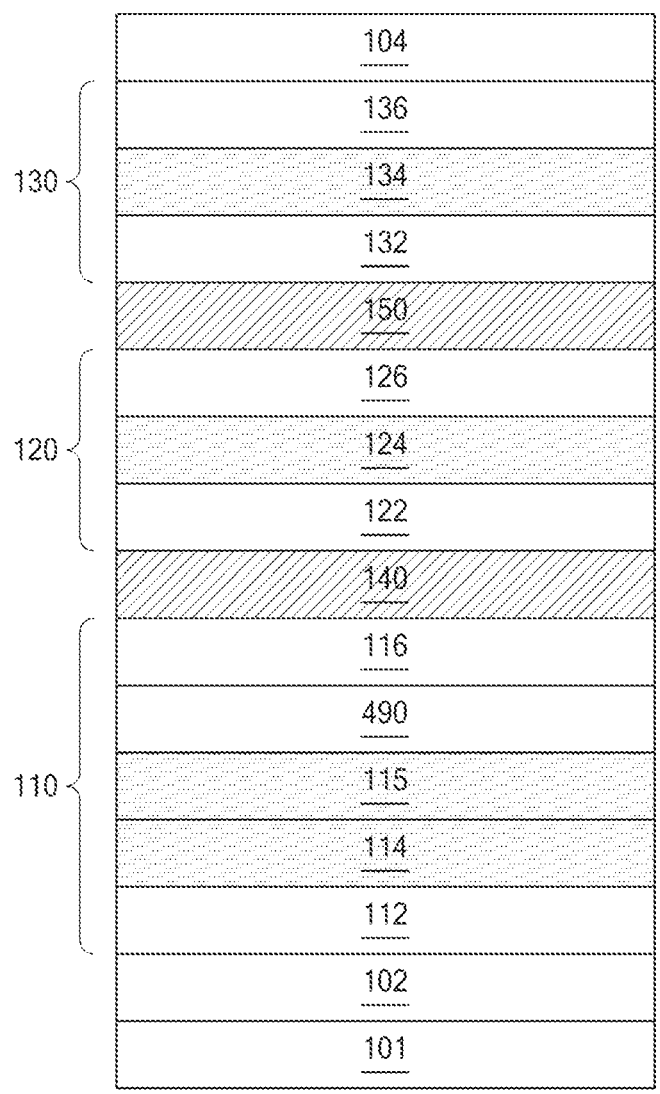
FIG. 9 is a diagram illustrating a white organic light emitting device according to another embodiment of the present invention.

FIG. 9 is a diagram illustrating a white organic light emitting device 500 according to another embodiment of the present invention. In describing the present embodiment, elements which are the same as or correspond to the preceding embodiment are not described.

The white organic light emitting device 500 according to another embodiment of the present invention includes first and second electrodes 102 and 104 and first to third emission parts 110 to 130 between the first and second electrodes 102 and 104.

A first EML 114 of the first emission part 110 may be configured with a red emission layer, and a second EML 115 may be configured with a yellow-green emission layer.

A first EML 124 of the second emission part 120 may be configured with a blue emission layer, and a first EML 134 of the third emission part 130 may be configured with a blue emission layer.

An EACL 490 may be provided in the first emission part 110. The EACL 490 may be configured with a yellow-green emission layer. When an emission part including the at least two emission layers is the first emission part 110, the second emission part 120 or the third emission part 130 may be configured with an emission layer including a blue emission layer. The EACL 490 may be adjacent to the at least two emission layers. The EACL 490 may be on the at least two emission layers. Alternatively, the EACL 490 may be just on the at least two emission layers.

The EACL 490 may be configured with an emission layer that emits light having the same color as that of light emitted from one of the at least two emission layers. Therefore, the EACL 490 may be configured with a yellow-green emission layer that emits light having the same color as that of light emitted from the yellow-green emission layer which is one of the at least two emission layers.

A peak wavelength of an emission area of the red emission layer which is the first EML 114 of the first emission part 110 may be 600 nm to 650 nm. A peak wavelength of an emission area of the yellow-green emission layer which is the second EML 115 may be 510 nm to 580 nm.

A peak wavelength of an emission area of the blue emission layer which is the first EML 124 of the second emission part 120 may be 440 nm to 480 nm.

A peak wavelength of an emission area of the blue emission layer which is the first EML 134 of the third emission part 130 may be 440 nm to 480 nm.

A peak wavelength of an emission area of the yellow-green emission layer which is the EACL 490 may be 510 nm to 580 nm.

The first EML 124 of the second emission part 120 may be configured with a red-blue emission layer depending on a structure or a characteristic of a device. A peak wavelength of an emission area of the red-blue emission layer may be 440 nm to 650 nm.

Moreover, the first EML 134 of the third emission part 130 may be configured with a red-blue emission layer depending on a structure or a characteristic of a device. A peak wavelength of an emission area of the red-blue emission layer may be 440 nm to 650 nm.

The first emission part 110 may be configured with at least two emission layers. The EACL 490 may provide separation for the emission areas of the at least two emission layers. Here, the EACL 490 may include a second host different from a first host which is included in one of the at least two emission layers. A dopant constituting the second EML 115 may be the same as a dopant constituting the EACL 490, and a host constituting the second EML 115 may differ from a host constituting the EACL 490. However, the present embodiment is not limited thereto.

A dopant constituting the second EML 115 of the first emission part 110 may be the same as a dopant constituting the EACL 490, and a host constituting the second EML 115 of the first emission part 110 may differ from a host constituting the EACL 490. However, the present embodiment is not limited thereto.

The host may consist of a hole host and an electron host which are two hosts, in addition to one host. A hole mobility of a host in the EACL 490 may be faster than a host of the second EML 115. For example, a hole mobility of the EACL 490 may be faster than $1\times10^{-5}$ cm$^2$/Vs. Therefore, an exciton generated in the EACL 490 is generated faster than an exciton generated in the second EML 115, and thus, the exciton of the second EML 115 is separated from the first EML 114. For this reason, the host constituting the yellow-green emission layer which is the second EML 115 and the host constituting the yellow-green emission layer which is the EACL 490 may be differently constituted. Therefore, a distribution of excitons generated in the first EML 114 may differ from a distribution of excitons generated in the second EML 115, and the emission area of the first EML 114 may be separated from the emission area of the second EML 115. Also, a hole mobility of the host constituting the yellow-green emission layer which is the second EML 115 may differ from a hole mobility of the host constituting the yellow-green emission layer which is the EACL 490. Accordingly, the emission area of the first EML 114 and the emission area of the second EML 115 may be controlled.

A density of the excitons generated in the first and second EMLs 114 and 115 may be lowered by the EACL 490 that provides separation for the emission areas of the at least two emission layers. That is, the EACL 490 may cause a density of the excitons, generated in the first EML 114, different from a density of the excitons generated in the second EML 115. Therefore, the distributed excitons of the second EML 115 are separated from the first EML 114 by the EACL 490. Accordingly, since the emission area of the first EML 114 is separated from the emission area of the second EML 115, agglomeration of emission areas is prevented, and a speed at which deterioration is made in the first emission part 110 is lowered. The EACL 490 may be a layer which causes the emission area of the first EML 114 to be separated from the emission area of the second EML 115. Also, the EACL 490 may be a layer which causes a distribution of the excitons, generated in the first EML 114, different from a distribution of the excitons generated in the second EML 115.

Accordingly, since emission areas are evenly distributed in the first emission part 110, deterioration of the first emission part 110 is reduced, and a life of a device is enhanced.

Moreover, the white organic light emitting device 500 according to another embodiment of the present invention may be applied to the bottom emission type, the top emission type, or the dual emission type.

Figure 10:
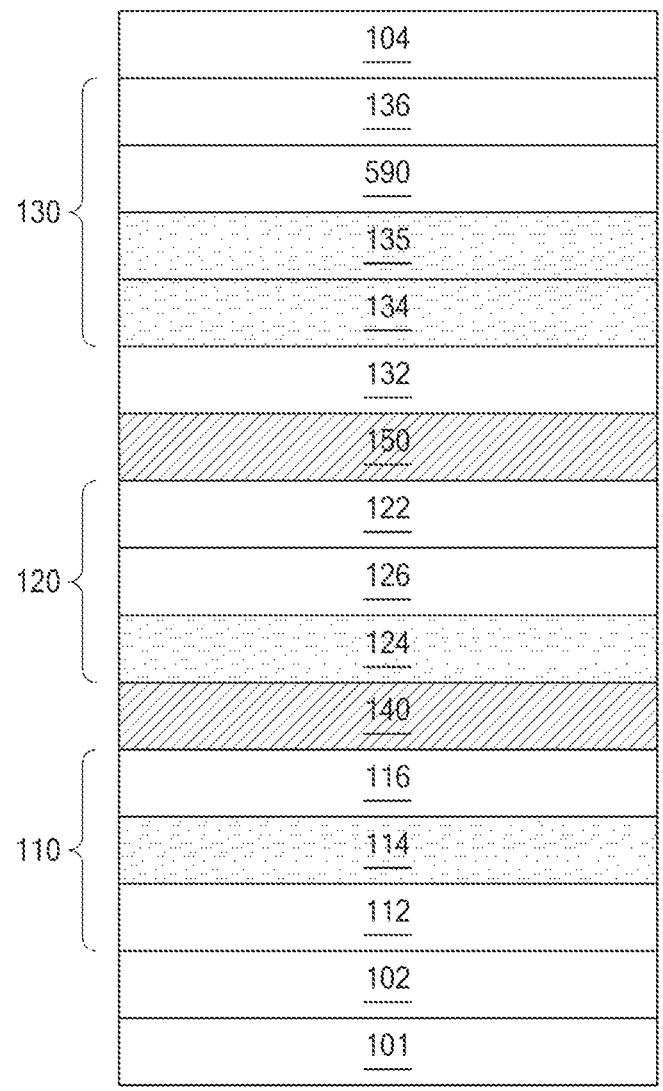
FIG. 10 is a diagram illustrating a white organic light emitting device according to another embodiment of the present invention.

FIG. 10 is a diagram illustrating a white organic light emitting device 600 according to another embodiment of the present invention. In describing the present embodiment, elements which are the same as or correspond to the preceding embodiment are not described.

The white organic light emitting device 600 according to another embodiment of the present invention includes first and second electrodes 102 and 104 and first to third emission parts 110 to 130 between the first and second electrodes 102 and 104.

A first EML 114 of the first emission part 110 may be configured with a blue emission layer, and a first EML 124 of the second emission part 120 may be configured with a blue emission layer.

A first EML 134 of the third emission part 130 may be configured with a red emission layer, and a second EML 135 may be configured with a yellow-green emission layer. An EACL 590 may be provided in the third emission part 130.

The EACL 590 may be configured with an emission layer that emits light having the same color as that of light emitted from one of the at least two emission layers. Therefore, the EACL 590 may be configured with a yellow-green emission layer that emits light having the same color as that of light emitted from the yellow-green emission layer which is one of the at least two emission layers. The EACL 590 may be adjacent to the at least two emission layers. The EACL 590 may be on the at least two emission layers. Alternatively, the EACL 590 may be just on the at least two emission layers.

When an emission part including the at least two emission layers is the third emission part 130, one among the first emission part 110 and the second emission part 120 may be configured with an emission layer including a blue emission layer. A peak wavelength of an emission area of the blue emission layer which is the first EML 114 of the first emission part 110 may be 440 nm to 480 nm.

A peak wavelength of an emission area of the blue emission layer which is the first EML 124 of the second emission part 120 may be 440 nm to 480 nm.

A peak wavelength of an emission area of the red emission layer which is the first EML 134 of the third emission part 130 may be 600 nm to 650 nm. A peak wavelength of an emission area of the yellow-green emission layer which is the second EML 135 may be 510 nm to 580 nm.

A peak wavelength of an emission area of the yellow-green emission layer which is the EACL 590 may be 510 nm to 580 nm.

The third emission part 130 may be configured with at least two emission layers. The EACL 590 may provide separation for the emission areas of the at least two emission layers. Here, the EACL 590 may include a second host different from a first host which is included in one of the at least two emission layers. A dopant constituting the second EML 135 of the third emission part 130 may be the same as a dopant constituting the EACL 590, and a host constituting the second EML 135 of the third emission part 130 may differ from a host constituting the EACL 590. However, the present embodiment is not limited thereto.

The host may consist of a hole host and an electron host which are two hosts, in addition to one host. A hole mobility of a host included in the EACL 590 may be faster than a host of the second EML 135. For example, a hole mobility of the EACL 590 may be faster than $1\times10^{-5}$ cm$^2$/Vs. Therefore, an exciton generated in the EACL 590 is generated faster than an exciton generated in the second EML 135, and thus, the exciton of the second EML 135 is separated from the first EML 134. For this reason, the host constituting the yellow-green emission layer which is the second EML 135 and the host constituting the yellow-green emission layer which is the EACL 590 may be differently constituted. Therefore, a distribution of excitons generated in the first EML 134 may differ from a distribution of excitons generated in the second EML 135, and the emission area of the first EML 134 may be separated from the emission area of the second EML 135. Also, a hole mobility of the host constituting the yellow-green emission layer which is the second EML 135 may differ from a hole mobility of the host constituting the yellow-green emission layer which is the EACL 590.

Accordingly, the emission area of the first EML 134 and the emission area of the second EML 135 may be controlled.

A density of the excitons generated in the first and second EMLs 134 and 135 may be lowered by the EACL 590 that provides separation for the emission areas of the at least two emission layers. That is, the EACL 590 may cause a density of the excitons, generated in the first EML 134, different from a density of the excitons generated in the second EML 135. Therefore, the distributed excitons of the second EML 135 are separated from the first EML 134 by the EACL 590. Accordingly, since the emission area of the first EML 134 is separated from the emission area of the second EML 135, agglomeration of emission areas is prevented, and a speed at which deterioration is made in the third emission part 130 is lowered. The EACL 590 may be a layer which causes the emission area of the first EML 134 to be separated from the emission area of the second EML 135. Also, the EACL 590 may be a layer which causes a distribution of the excitons, generated in the first EML 134, different from a distribution of the excitons generated in the second EML 135. Accordingly, since emission areas are evenly distributed in the third emission part 130, deterioration of the third emission part 130 is reduced, and a life of a device is enhanced.

The first EML 114 of the first emission part 110 may be configured with a red-blue emission layer depending on a structure or a characteristic of a device. A peak wavelength of an emission area of the red-blue emission layer may be 440 nm to 650 nm.

Moreover, the first EML 124 of the second emission part 120 may be configured with a red-blue emission layer depending on a structure or a characteristic of a device. A peak wavelength of an emission area of the red-blue emission layer may be 440 nm to 650 nm.

Moreover, the white organic light emitting device 600 according to another embodiment of the present invention may be applied to the bottom emission type, the top emission type, or the dual emission type.

As described above, it can be seen that when two emission layers are in one emission part, emission areas of the two emission layers are separated from each other, and thus, agglomeration of emission areas which occurs between the two emission layers is prevented by an EACL. Therefore, it can be seen that emission areas are evenly distributed, and by separating emission areas of at least two emission layers, an emission area increases, and emission intensity increases in a desired wavelength range.

Accordingly, since the emission areas are evenly distributed in the emission part, deterioration of the emission part is reduced, and the lifetime of a device is enhanced.

According to the embodiments of the present invention, the emission area control layer for evenly distributing emission areas of an emission part is provided, thereby enhancing the lifetime of a device.

Moreover, the emission layers are prevented from being deteriorated, thereby enhancing a reliability of a device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A white organic light emitting device comprising:
   a first emission part between a first electrode and a second electrode; and
   a second emission part on the first emission part,
   wherein at least one among the first emission part and the second emission part comprises:
   at least two emission layers, the at least two emission layers comprising a first dopant and a second dopant different from the first dopant; and
   an emission area control layer (EACL) that provides separation for emission areas of the at least two emission layers, wherein the EACL includes a second host different from a first host included in one of the at least two emission layers and includes at least one of the first dopant and the second dopant of the at least two emission layers.

2. The white organic light emitting device of claim 1, wherein the EACL is a yellow-green emission layer.

3. The white organic light emitting device of claim 1, wherein when an emission part including the at least two emission layers is the second emission part, the first emission part comprises an emission layer including a blue emission layer.

4. The white organic light emitting device of claim 1, wherein when an emission part including the at least two emission layers is the first emission part, the second emission part comprises an emission layer including a blue emission layer.

5. The white organic light emitting device of claim 1, wherein the EACL is adjacent to the at least two emission layers.

6. A white organic light emitting device comprising:
   a first emission part between a first electrode and a second electrode; and
   a second emission part on the first emission part,
   wherein at least one among the first emission part and the second emission part comprises:
   at least two emission layers, wherein the at least two emission layers comprise a red emission layer and a yellow-green emission layer; and
   an emission area control layer (EACL) that provides separation for emission areas of the at least two emission layers and includes a second host different from a first host included in one of the at least two emission layers.

7. The white organic light emitting device of claim 6, wherein a dopant of the EACL is the same as a dopant of the yellow-green emission layer of the at least two emission layers.

8. The white organic light emitting device of claim 6, wherein the emission areas of the at least two emission layers are separated based on a difference between a hole mobility of a host of the EACL and a hole mobility of a host of the yellow-green emission layer.

9. The white organic light emitting device of claim 8, wherein the hole mobility of the host of the EACL is faster than the hole mobility of the host of the yellow-green emission layer.

10. A white organic light emitting device comprising:
    a first emission part between a first electrode and a second electrode;
    a second emission part on the first emission part; and
    a third emission part on the second emission part,
    wherein at least one among the first emission part, the second emission part, and the third emission part comprises at least two emission layers and an emission area control layer (EACL) that provides separation for emission areas of the at least two emission layers, wherein the EACL includes an emission layer that emits light having a same color as a color of light emitted from one of the at least two emission layers.

11. The white organic light emitting device of claim 10, wherein an emission part including the at least two emission layers comprises the EACL.

12. The white organic light emitting device of claim 10, wherein the EACL is adjacent to the at least two emission layers.

13. The white organic light emitting device of claim 10, wherein when an emission part including the at least two emission layers is the second emission part, one among the first emission part and the third emission part comprises an emission layer including a blue emission layer.

14. The white organic light emitting device of claim 10, wherein when an emission part including the at least two emission layers is the first emission part, one among the second emission part and the third emission part comprises an emission layer including a blue emission layer.

15. The white organic light emitting device of claim 10, wherein when an emission part including the at least two emission layers is the third emission part, one among the first emission part and the second emission part comprises an emission layer including a blue emission layer.

16. A white organic light emitting device comprising:
a first emission part between a first electrode and a second electrode;
a second emission part on the first emission part; and
a third emission part on the second emission part,
wherein at least one among the first emission part, the second emission part, and the third emission part comprises at least two emission layers and an emission area control layer (EACL) that provides separation for emission areas of the at least two emission layers, wherein the at least two emission layers comprise a red emission layer and a yellow-green emission layer, and wherein the EACL includes an emission layer that emits light having a same color as a color of light emitted from one of the at least two emission layers.

17. A white organic light emitting device comprising:
a first emission part between a first electrode and a second electrode;
a second emission part on the first emission part; and
a third emission part on the second emission part,
wherein at least one among the first emission part, the second emission part, and the third emission part comprises at least two emission layers and an emission area control layer (EACL) that provides separation for emission areas of the at least two emission layers, wherein the EACL is a yellow-green emission layer that emits light having a same color as a color of light emitted from one of the at least two emission layers.

18. The white organic light emitting device of claim 17, wherein
a dopant of the EACL is the same as a dopant of the yellow-green emission layer which is one of the at least two emission layers, and
a host of the EACL differs from a host of the yellow-green emission layer which is one of the at least two emission layers.

19. The white organic light emitting device of claim 18, wherein the emission areas of the at least two emission layers are separated based on a difference between a hole mobility of the host of the EACL and a hole mobility of the host of the yellow-green emission layer.

20. The white organic light emitting device of claim 19, wherein the hole mobility of the host of the EACL is faster than the hole mobility of the host of the yellow-green emission layer.

21. A white organic light emitting device comprising:
a first emission part between a first electrode and a second electrode; and
a second emission part on the first emission part,
wherein at least one among the first emission part and the second emission part comprises:
at least two emission layers, the at least two emission layers comprising a first dopant and a second dopant different from the first dopant; and
a layer that causes emission areas of the at least two emission layers to be separated from each other, wherein the layer includes at least one of the first dopant and the second dopant of the at least two emission layers.

22. The white organic light emitting device of claim 21, wherein the layer causes a density of excitons, generated in one of the at least two emission layers, different from a density of excitons generated in another emission layer.

23. The white organic light emitting device of claim 21, wherein the second emission part comprises the at least two emission layers.

24. The white organic light emitting device of claim 23, wherein the at least two emission layers comprise a red emission layer and a yellow-green emission layer.

25. The white organic light emitting device of claim 24, wherein
a dopant of the layer is the same as a dopant of the yellow-green emission layer in the second emission part, and
a host of the layer differs from a host of the yellow-green emission layer.

26. The white organic light emitting device of claim 25, wherein a hole mobility of the host in the layer is faster than a hole mobility of the host in the yellow-green emission layer.

27. The white organic light emitting device of claim 25, wherein the hosts which differ and are respectively in the layer and the yellow-green emission layer of the second emission part cause a distribution of excitons, generated in one of the at least two emission layers, different from a distribution of excitons generated in another emission layer and cause the emission areas of the at least two emission layers to be separated from each other.

28. The white organic light emitting device of claim 23, wherein the layer is in the second emission part and the layer includes a yellow-green emission layer.

29. The white organic light emitting device of claim 21, further comprising a third emission part on the second emission part.

30. The white organic light emitting device of claim 29, wherein when an emission part including the at least two emission layers is the second emission part, each of the first emission part and the third emission part comprises an emission layer including a blue emission layer.

* * * * *